(12) United States Patent
Mende et al.

(10) Patent No.: US 10,585,118 B2
(45) Date of Patent: Mar. 10, 2020

(54) WIDE RANGE COMPENSATION OF LOW FREQUENCY RESPONSE PASSIVE PROBE

(71) Applicant: Tektronix, Inc., Beaverton, OR (US)

(72) Inventors: Michael J. Mende, Portland, OR (US); Richard A. Booman, Lake Oswego, OR (US); Wayne M. Wilburn, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 148 days.

(21) Appl. No.: 15/721,604

(22) Filed: Sep. 29, 2017

(65) Prior Publication Data

US 2018/0328961 A1 Nov. 15, 2018

Related U.S. Application Data

(60) Provisional application No. 62/504,332, filed on May 10, 2017.

(51) Int. Cl.
*G01R 31/20* (2006.01)
*G01R 1/067* (2006.01)
*H03H 1/02* (2006.01)
*G01R 31/319* (2006.01)
*G01R 1/073* (2006.01)

(52) U.S. Cl.
CPC ..... *G01R 1/06766* (2013.01); *G01R 1/06772* (2013.01); *G01R 1/07328* (2013.01); *G01R 31/31905* (2013.01); *H03H 1/02* (2013.01)

(58) Field of Classification Search
CPC ................ G01R 1/067; G01R 1/06766; G01R 1/06738; G01R 1/06788; G01R 1/073; G01R 1/07328; G01R 1/44; G01R 1/06772; G01R 1/319; G01R 1/31905; G01R 1/3177; G01R 1/31726; G01R 1/31725; G01R 1/3025; G01R 1/2886; G01R 1/2806; G01R 35/005; G01R 23/16

See application file for complete search history.

(56) References Cited

U.S. PATENT DOCUMENTS

| | | | | |
|---|---|---|---|---|
| 3,256,484 | A * | 6/1966 | Terry | G01R 1/06777 174/17 R |
| 4,070,615 | A * | 1/1978 | Crop | G01R 17/02 324/601 |
| 4,739,259 | A * | 4/1988 | Hadwin | G01R 1/06766 324/72.5 |
| 7,728,607 | B2 * | 6/2010 | Forbes | G01R 1/06788 324/755.02 |
| 2007/0164730 | A1 * | 7/2007 | Pollock | G01R 1/06766 324/754.07 |
| 2007/0164731 | A1 * | 7/2007 | Pollock | G01R 1/06766 324/754.07 |
| 2013/0221985 | A1 * | 8/2013 | Bartlett | G01R 1/06766 324/601 |

* cited by examiner

*Primary Examiner* — Thang X Le
(74) *Attorney, Agent, or Firm* — Miller Nash Graham & Dunn; Andrew J. Harrington

(57) ABSTRACT

Disclosed is a test and measurement probe. The test and measurement probe includes a probe tip to connect to a Device Under Test (DUT). The probe tip includes a Resistor Capacitor (RC) probe tip network coupled to a test signal channel. The test and measurement probe also includes at least one variable resistor coupled to the test signal channel. The at least one variable resistor is set to provide an adjustable resistance to compensate for frequency variation in the RC probe tip network.

18 Claims, 3 Drawing Sheets

WIDE RANGE COMPENSATION OF LOW FREQUENCY RESPONSE PASSIVE PROBE

CROSS-REFERENCES TO RELATED APPLICATIONS

The present application claims benefit from U.S. Provisional Patent Application Ser. No. 62/504,332, filed May 10, 2017, and entitled "Wide Range Compensation Of Low Frequency Response Passive Probe," which is incorporated herein by reference as if reproduced in its entirety.

FIELD OF THE INVENTION

This disclosure is directed to mechanisms associated with aspects of a test and measurement probe, and, more particularly, to mechanisms to compensate for frequency response variations in a test and measurement probe.

BACKGROUND

Test and measurement systems are designed to receive and measure test signals, for example from a Device Under Test (DUT). For example, a test and measurement system, such as an oscilloscope, may couple to a DUT via a probe. The probes may be classified according to an amount of attenuation provided by the probe. For example, a probe may attenuate a signal by a factor of one (a 1× probe), by a factor of ten (a 10× probe), by a factor of one hundred (a 100× probe), by a factor of one thousand (a 1000× probe), etc. Different probes are employed for different testing scenarios. Probes are expected to provide a constant attenuation across a wide frequency spectrum. However, natural variation of probe's components may result in changes in attenuation across the frequency spectrum. If a test setup fails to properly compensate for such variation, the variable attenuation may be interpreted as part of the test signal from the DUT instead of as equipment related noise.

Examples in the disclosure address these and other issues.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Figure 1:
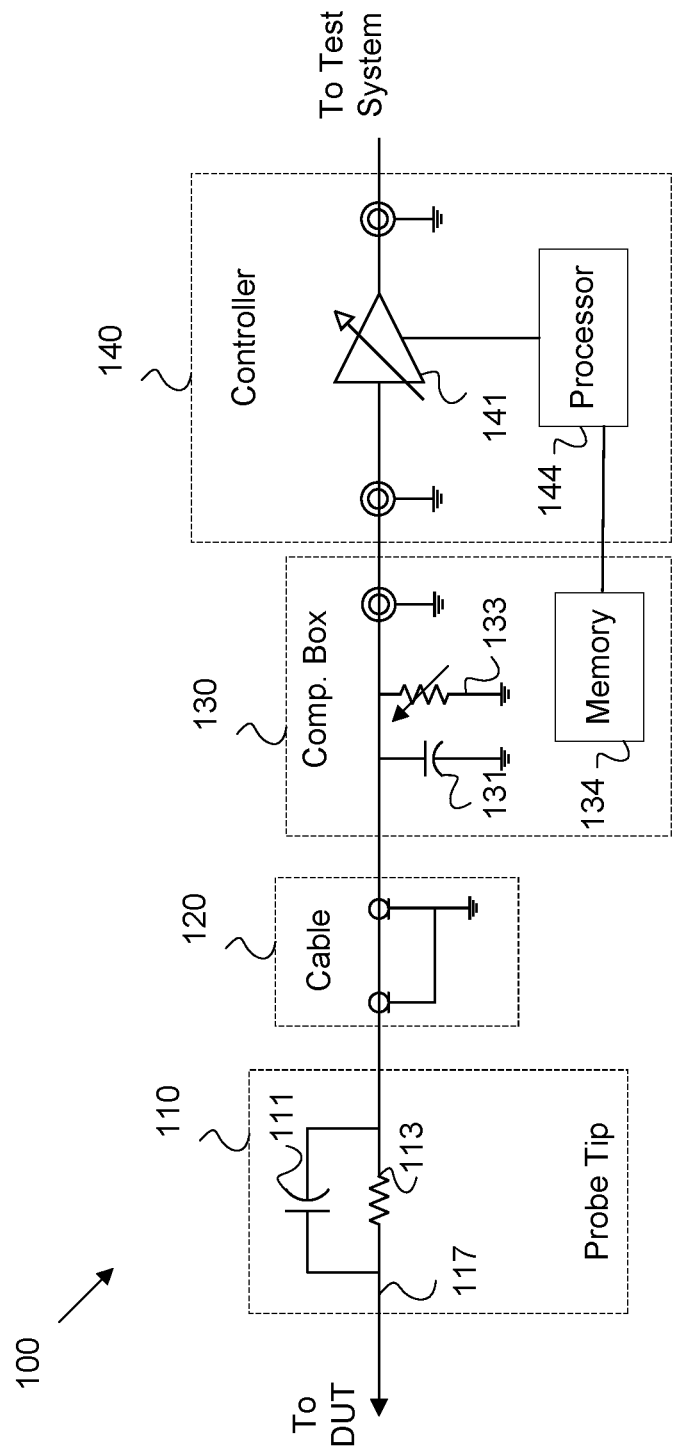
FIG. 1 is a schematic diagram of an example test network to compensate for a frequency response of a test probe tip.

A probe may employ a probe tip to connect to the DUT. The probe tip may employ various circuit elements that result in electrical resistance and electrical capacitance. Such elements may be modeled as a Resistor Capacitor (RC) network for compensation purposes. A corresponding RC compensation network may be employed to compensate for an uneven frequency response of the RC network in the probe tip. For example, after manufacturing a probe frequency response may be tested, and the RC compensation network may be adjusted and set to compensate for the variation caused by the RC network of the probe tip. An example RC compensation network may include static resistors and a variable capacitor. The variable capacitor may be adjusted to tune/match the high frequency signal response (e.g. Kilohertz (kHz) and above) of the probe with the Direct Current (DC)/low frequency response of the probe set by the static resistor network to achieve a constant attenuation across a wide frequency range. However, there are several problems with employing a variable capacitor for this purpose. For example, variable capacitors may provide varying levels of capacitance based on changes in environmental factors, such as humidity. This may result in variation in the frequency response of the probe when employed by the end user (e.g. depending on user location). Further, variable capacitors may have relatively large step values between settings, which may in turn create difficulties when attempting to fine tune the RC compensation network to certain values. Further, when creating high attenuation probes, such as 1000×, a variable capacitor may be required to provide a very wide range of capacitances for tuning purposes. Capacitors configured to provide such wide ranges may be physically large, and hence impractical for use in probe design.

Disclosed herein is a probe design that compensates for an inaccurate frequency response of a probe tip RC network by employing a variable resistor in an RC compensation network. The variable resistor is employed to tune the low frequency response (e.g. kilohertz (kHz)) of the probe until a compensated/flat frequency response is achieved. In other words, the variable resistor is used to match the shunt/lower leg RC time constant with the probe tip RC time constant. By adjusting the variable resistor in either the probe tip or shunt/lower leg, the two time constants can be matched resulting in a compensated/flat response (e.g. low frequency response matches the high frequency response or comes within an acceptable threshold). Adjusting a variable resistor may alter the attenuation provided by the probe. Accordingly, the system may employ an adjustable amplifier that adjusts the gain of a test system to compensate for attenuation variation caused by the variable resistor. As an example, the RC compensation network may be positioned in a compensation box, which may be attached to the probe tip via a cable or other electrically conductive medium. A memory may store the attenuation caused by the variable resistor setting. A controller may then read the memory and adjust the adjustable amplifier accordingly (e.g., inverse to the attenuation). In other examples, an oscilloscope containing the adjustable amplifier may be set based on the variable resistor setting (e.g., a setting printed on the probe). In yet another example, the variable resistor and the adjustable amplifier may both be enclosed in the probe. In order to provide fine control over the resistance in the RC compensation network, the RC compensation network may include fine adjustment variable resistors and coarse adjustment variable resistors. For example, coarse adjustment variable resistor(s) may be positioned in a probe tip, and fine adjustment variable resistors may be positioned in a compensation box. Further, the system may be implemented to compensate for probe tips that are configured as single attenuator or balanced differential inputs.

In other words, this disclosure describes a mechanism to accurately and reliably compensate the frequency response, especially low-frequency response, of a passive probe/accessory over a wide compensation range without the use of a variable capacitor. It may be desirable to reduce the probe tip capacitance as much as possible to reduce high frequency loading on the DUT. At high attenuation values with low tip capacitance, it becomes impractical to implement an adjustable capacitor with sufficient adjustment range, due to the variation of the tip capacitance. For example, when employing a 1000× probe attenuation and a tip capacitance of one picofarad (pF)+/−0.1 pF, the resulting adjustable capacitor nominal value would be 999 pF with an adjustment range of +/−99.9 pF. In order to achieve such an adjustment range, the variable capacitor would be of a large physical size, with degraded high frequency performance. On top of this, slight variations in the variable capacitor due to temperature and humidity have severe impacts on overall electrical performance. This disclosure instead provides for a fixed capacitance value and adjustable resistance to perform the compensation. Since adjusting the resistance changes the overall attenuation of the signal, a variable amplifier adjusts the overall gain of the system to account for this variation in attenuation from probe/accessory-to-probe/accessory. Use of the variable resistor may be beneficial over the use of a variable capacitor because the variable resistor is physically smaller, provides lower drift, has the ability to adjust for a large compensation range, and lower cost. Furthermore, when the probe/accessory is compensated, the effect of the compensation (e.g., attenuation) can be measured and can be stored in a memory (e.g., an Electrically Erasable Programmable Read-Only Memory (EEPROM)) or other computer-readable storage media. In some instances, the probe/accessory can undergo a calibration phase (e.g., at the factory or in the field) where various settings of the variable resistor can be cycled through utilizing a known signal. The effect of the various settings on the known signal can then be quantified (e.g., a measured change in voltage) and. By storing the effect of the various settings of the variable resistor on a signal, the system can correlate the compensation (e.g., the variable resistor setting) with an expected effect, such as attenuation and can increase or decrease the overall system gain to compensate for this or achieve a desired range the user expects for a particular probe/accessory.

FIG. 1 is a schematic diagram of an example test network 100 to compensate for a frequency response of a test probe tip 110. The network 100 includes a probe tip 110, a cable 120, a compensation box 130, and a controller 140. The probe tip 110 is configured to connect to a DUT. An RC compensation network including a capacitor 131 and a variable resistor 133 is positioned in the compensation box 130 and coupled to the probe tip 110 via the cable 120. The compensation box 130 is coupled to the controller 140. It should be noted that other components, such as a sensor head, may be positioned between the compensation box 130 and the controller 140. The controller 140 may then be coupled to a test system, such as an oscilloscope, for example via additional cables/connectors.

Figure 2:
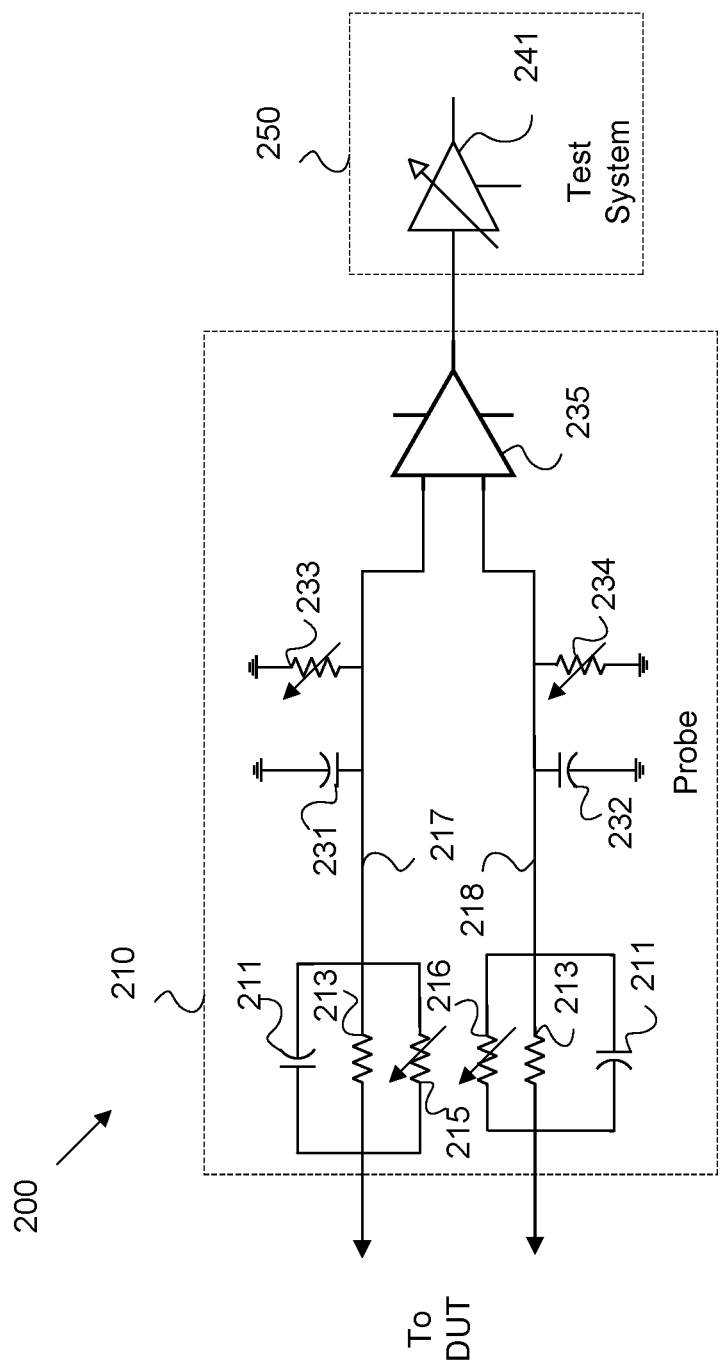
FIG. 2 is a schematic diagram of another example test network to compensate for a frequency response of a test probe tip.
Figure 3:
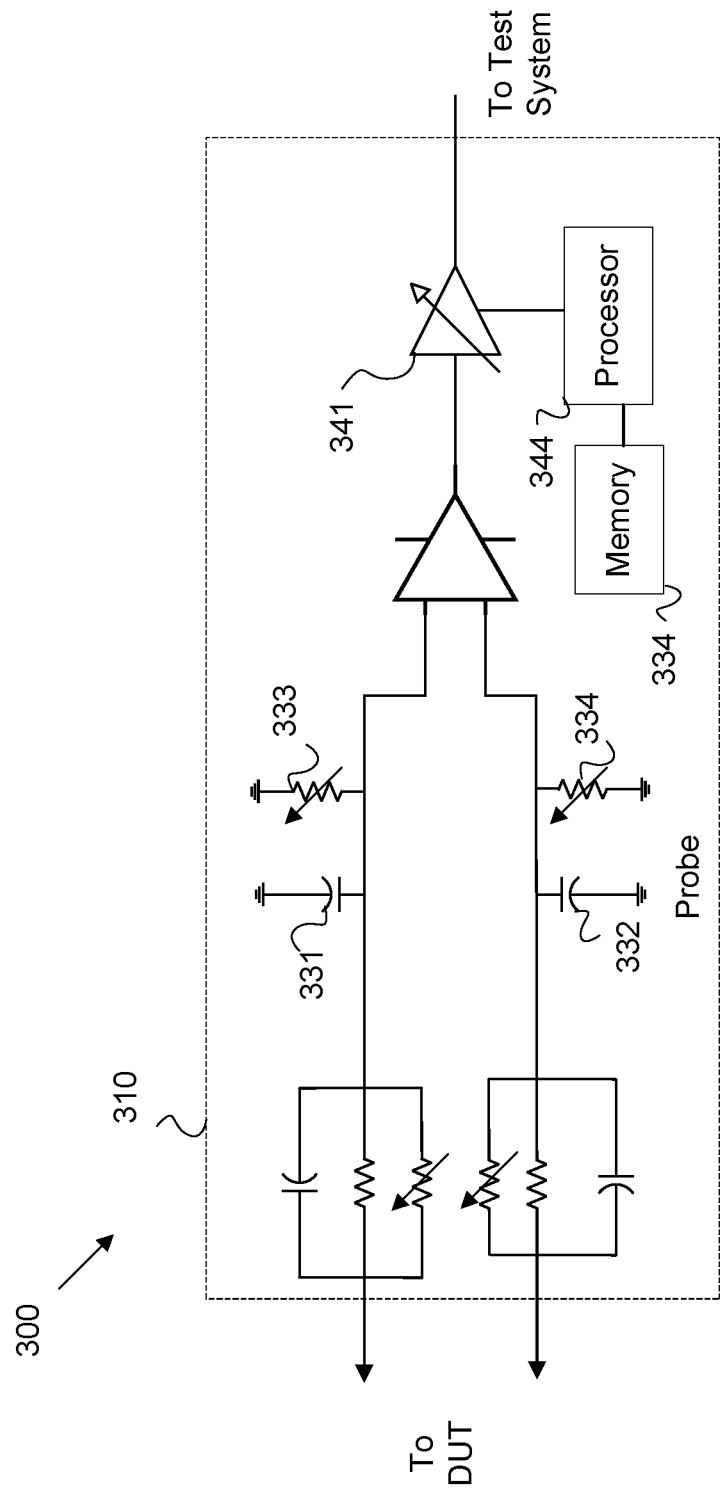
FIG. 3 is a schematic diagram of yet another example test network to compensate for a frequency response of a test probe tip.

A probe tip 110 is an electrically conductive device designed to connect to a DUT. For example, the DUT may include signal pins, and the probe tip 110 may be configured to attach to, or make contact with, one or more of the DUT signal pins in an electrically conductive manner. The probe tip 110 includes a test signal channel 117, which is an electrically conductive path for conducting a test signal. The test signal channel 117 may be a single channel for a single ended signal as shown in FIG. 1 or a differential channel as depicted in FIGS. 2-3. The probe tip 110 includes an RC network (also referred to herein as an RC probe tip network) coupled to the test signal channel 117. The RC network includes various electrical components designed to couple to the DUT and conduct a test signal from the DUT along the test signal channel 117. While the exact nature of the RC network varies based on the structure of probe tip 110, from an electrical standpoint, the RC network can be reduced to a resistor 113 and a capacitor 111 for purposes of simplicity and clarity of discussion. As such, the resistor 113 represents all resistive elements in the probe tip 110 and the capacitor 111 represents all capacitive elements in the probe tip 110. As noted above, the resistance and capacitance of the resistor 113 and capacitor 111, respectively, may vary across a product line due to variations in manufacturing.

The probe tip 110 may be coupled to the compensation box 130 via a cable 120. The cable 120 may be any electrically conductive medium for coupling the test signal channel 117 from the probe tip 110 to the compensation box 130. The compensation box 130 is an enclosure for housing an RC compensation network to compensate for the RC network of the probe tip 110. The compensation box 130 may also include connectors to connect the probe and the test signal channel 117 to additional components, for example via a coaxial cable. The RC compensation network contains at least one variable resistor 133 and at least one static capacitor 131. In order to avoid the issues mentioned above, the RC compensation network in the compensation box 130 may not include an adjustable capacitor. As noted above, a probe should provide a specified attenuation (e.g. 1×, 10×, 100×, 1000×, etc.). Such attenuation should be constant across frequencies. Hence the frequency response of a test signal across the test signal channel 117 should appear as a constant attenuation across a wide range of frequencies. The RC compensation network allows the lower frequencies to be tuned relative to the higher frequencies to obtain a compensated/flat response. In other words, the static capacitor 131 provides a fixed capacitance and constant frequency response at high frequencies, while the variable resistor 133 provides a variable resistance and adjustable frequency response at low frequencies. The capacitor 131 and the variable resistor 133 may be coupled to the test signal channel 117 as shown. As such, the variable resistor 133 provides an adjustable resistance to compensate for variations in frequency response (e.g. low frequency response variations) in the RC network of the probe tip 110. As used herein low frequency may refer to a lower portion of a frequency band being processed (e.g., frequencies below one megahertz (MHz)) and high frequency may refer to any frequency at or above the lower portion (e.g., at or above one MHz). This can be accomplished independent of a variable capacitor (i.e., without utilizing a variable capacitor) for at least the compensation aspects.

It should be noted that while a single variable resistor 133 is depicted, multiple variable resistors may be employed in series or parallel, depending on various implementation considerations. For example, the variable resistor 133 may be a coarse variable resistor enabling wide variations in resistance and a fine variable resistor enabling small variations in resistance. Employing both coarse and fine variable resistors 133 may allow for more precise compensation. In other words, a coarse resistor provides a wide range of resistances, but lacks precision (e.g. 10 k Ohm resistance increments). Meanwhile a fine resistor provides precision, but lacks a wide range (e.g. 1 k Ohm resistance increments). By employing both, a probe tip 110 may select virtually any resistance value desired for accurate frequency response compensation. Further, variable resistor(s) 133 may also be positioned in multiple locations. For example, a coarse variable resistor 133 may be positioned in the probe tip 110 and a fine variable resistor 133 may be positioned in the compensation box 130, or vice versa, in some examples.

The variable resistor 133 may include various types of components. For example, the variable resistor 133 may include a mechanical resistor. Such a mechanical resistor may include a conductive plate with a movable conductive arm. Adjusting the position of the arm adjusts the amount of the conductive plate that a signal is routed through and thereby adjusts the resistance of the resistor. As another example, the variable resistor 133 may be a digital resistor, such as a digital potentiometer, also known as a digiPot. In practice, the frequency response of the probe may be tested after manufacturing. The resistance of the variable resistor 133 may then be set to provide an expected frequency response, and hence compensate for the RC network in the probe tip 110.

In an alternate embodiment, the variable resistor 133 may be set in the field prior to use. This approach can allow for compensation of frequency response changes related to the testing environment (e.g., temperature). In such a scenario, the resistance of the variable resistor may be altered to achieve a desired/expected frequency response. This can be accomplished automatically or with input from a user. For instance, an end user may forward a known signal of varying frequencies through the probe tip 110 and measure the frequency response of the signal at an oscilloscope. The user could then alter the resistance of the variable resistor 133 (e.g. via a knob, digital interface, etc.) until an expected frequency response is achieved. For example, a signal that results in a square pulse in the frequency domain may be forwarded through the probe tip 110. The resistance of the variable resistor 133 may then be changed until a square wave is achieved in a graticule of the oscilloscope (or a display attached thereto) displaying in the frequency domain. In other embodiments, controller 140 may be configured to set the resistance of the variable resistor automatically to achieve the desired frequency response. This could be accomplished in a number of ways. For instance, this could be accomplished by storing in memory known settings of the variable resistor to achieve the desired frequency response at various environmental variables. These resistor settings could be stored during a compensation calibration performed during production or by a vendor. For example, the memory could correlate temperatures, or any other environmental variables or combinations thereof, with respective resistor settings to achieve the desired frequency response. In such an example, the resistor settings could be automatically selected based on measurements of the current operating environment of test network 100. It will be appreciated that the environmental variables can be measured in any number of conventional ways.

The setting employed for the variable resistor 133 may affect the gain of a test signal traversing the signal channel 117. Hence, an adjustable amplifier 141 may be employed to adjust the gain of the test signal in the test signal channel 117 to compensate for voltage changes caused by the variable resistor 133. To accomplish this gain adjustment, the compensation box 130 may also include a memory module 134. The memory module 134 may be any form of memory, such as a (RAM), Read Only Memory (ROM), Electrically Erasable Programmable Read-Only Memory (EEPROM), flash memory or other memory technology. The voltage gain/change caused by variable resistor 133 may be stored in the memory module 134. The memory module 134 may then provide the voltage change to the controller 140 with an adjustable amplifier 141 to support adjustment of the gain of a test signal in the test signal channel 117 to compensate for the voltage change by the variable resistor 133. In another example, the stored voltage gain/change may also/instead be employed to adjust a scaling factor in a digitizer, such as an analog to digital converter (A/D) and/or a digital oscilloscope. This allows the digitizer to take the variation in probe gain into account before recording and/or displaying the resulting signal. In embodiments where the settings of the variable resistor can be adjusted in the field, the various settings of the variable resistor can be correlated with corresponding voltage gain/changes caused by each of these various settings. Then the setting applied to the resistor can be cross-referenced with the voltage gain/change needed for the applied setting.

The network also includes a controller 140 coupled to the compensation box 130 via the test signal channel 117. A controller 140 is a component to control the functionality of the probe during testing and provide status feedback to a user. The controller 140 may include an adjustable amplifier 141 positioned along the signal channel 117. An adjustable amplifier 141 is any component that can dynamically increase or decrease the gain of a signal, or portions thereof. The controller 140 may also include a processor 144, which may be any processing circuit configured to perform one or more aspects described herein, such as a field programmable gate array (FPGA), a digital signal processor (DSP), an application specific integrated circuit (ASIC), or other electrical management circuit. The processor 144 may be configured to read the memory 134, and control the adjustable amplifier 141 accordingly. As such, the controller 140 may be employed to control the adjustable amplifier 141 to adjust the gain of a test signal in the test signal channel 117 to compensate for a voltage change caused by the variable resistor 113. For example, the processor 144 may determine a gain change caused by the variable resistor 113, such as an attenuation, and control the adjustable amplifier 141 to cause an approximately equal and opposite gain change, such as an amplification. As a result, the variable resistor 133 can adjust for the RC network in the probe tip 110 without the corresponding gain change effecting the test signal. It should be noted that the controller 140 is an optional component. In some examples, the adjustable amplifier 141 may be positioned in the probe (e.g. in the compensation box 130) or in the test system. Further, reading the voltage change from memory is an example mechanism for controlling the adjustable amplifier 141. The voltage change may also be signaled to a processor 144 operating the adjustable amplifier 141 or even input by the end user in some cases.

FIG. 2 is a schematic diagram of another example test network 200 to compensate for a frequency response of a balanced test probe tip. The network 200 includes a probe 210, which may be similar to probe tip 110 and compensation box 130. Unlike network 100, the probe 210 is configured for differential signals. The probe 210 includes a differential channel that includes a reference channel 218 and a signal channel 217. A differential signal is interpreted as a difference between a test signal and a reference signal. Hence, the reference channel 218 and a signal channel 217 are designed to conduct the reference signal and the test signal, respectively.

The probe 210 may contain resistive and capacitive elements for the reference channel 218 and the signal channel 217. Such components can be reduced to an RC network with a resistor 213 and a capacitor 211, which are substantially similar to resistor 113 and capacitor 111, respectively. The probe 210 also includes an RC compensation network to compensate for the frequency response of the resistor 213 and the capacitor 211 in the probe tip. The RC compensation network includes a reference channel variable resistor 234 coupled to the reference channel 218 and a signal channel variable resistor 233 coupled to the signal channel 217. The reference channel variable resistor 234 and the signal channel variable resistor 233, may be substantially similar to variable resistor 133, but may be employed to compensate for each channel separately. The RC compensation network may also include a reference capacitor 232 coupled to the reference channel 218 and a signal channel capacitor 231 coupled to the signal channel 217, respectively. The reference capacitor 232 and the signal channel capacitor 231 may be static capacitors, and may be substantially similar to capacitor 131. Hence, the RC compensation network may not include an adjustable capacitor.

Optionally, the probe 210 may also include coarse adjustment variable resistor and fine adjustment variable resistors for precise compensation. As shown, the probe 210 may include a coarse adjustment signal channel variable resistor 215 coupled to the signal channel 217 and a coarse adjustment reference channel variable resistor 216 coupled to the reference channel 218, respectively. The variable resistors 215 and 216 may be substantially similar to variable resistors 233 and 234, respectively, but may have wider distances between resistor settings. This allows the variable resistors 215 and 216 to be adjusted for coarse calibration and variable resistors 233 and 234 to be adjusted for fine calibration. As an example, the variable resistors 215-216 may be positioned in the probe tip and the variable resistors 233-234 may be positioned in a compensation box.

The probe 210 may also include a buffer/amplifier 235 to convert the differential channels into a single channel for communication to a test system 250. The buffer/amplifier 235 may include a balun or other differential to single ended signal conversion device. The test signal may be forwarded to the test system 250 via a cable or other electrically conductive medium.

The test system 250 is any device configured to sample a test signal from a DUT. For example, the test system 250 may include an oscilloscope. The test system 250 may include an adjustable amplifier 241, which may be similar to adjustable amplifier 141. As an example, the test system 250 may be configured to retrieve from memory, or allow a user to input, a value indicating voltage change caused by the resistors 215, 216, 234, and 233. Where a user inputs the value, such information may be, for example, printed on the probe 210. The test system 250 may receive the information and control the adjustable amplifier 241 to adjust the gain of a test signal in the signal channel 217 and the reference channel 218 to compensate for the voltage change caused by the resistors 215, 216, 234, and 233.

FIG. 3 is a schematic diagram of yet another example test network 300 to compensate for a frequency response of a test probe tip. Network 300 is similar to networks 100 and 200, but is designed to include both an RC compensation network and an adjustable amplifier 341 in a probe 310. The probe 310 includes a compensation network with static capacitors 331 and 332 and variable resistors 333 and 334, which may be substantially similar to capacitors 231 and 232 and variable resistors 233 and 234, respectively. The variable resistors 333 and 334 may be employed to compensate for the frequency response of the probe tip of the probe 310 as discussed above. The probe 310 also includes a memory 334, a processor 344, and an adjustable amplifier 341, which may be substantially similar to memory 134, processor 144, and adjustable amplifier 141, respectively. Hence, the processor 344 can employ data stored in memory 334 (e.g., a voltage change caused by the variable resistor) to set the adjustable amplifier 341 in order to adjust a gain of a test signal in the test signal channel to compensate for a voltage change caused by the variable resistors 333 and 334. As an example, the memory 334, processor 344, and adjustable amplifier 341 may be positioned in a compensation box. This design allows the probe 310 to compensate for the probe tip frequency response variance in a single device, without requiring the aid of a separate controller or settings in the test system. Otherwise, the operation of network 300 is substantially similar to test network 100 and/or 200. It should also be noted that the probe 310 could also be redesigned from a differential probe, as shown, into a single ended probe by removing a buffer/amplifier and one of the signal channels along with coupled components. Accordingly, one of skill in the art will understand that an RC compensation network and an adjustable amplifier can be configured in many different ways and positioned in many different permutations of components while still compensating for frequency response variation in a probe tip without departing from the scope of the present disclosure.

Examples of the disclosure may operate on a particularly created hardware, on firmware, digital signal processors, or on a specially programmed computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 includes a test and measurement probe comprising: a probe tip to connect to a Device Under Test (DUT), the probe tip including a Resistor Capacitor (RC) probe tip network coupled to a test signal channel; and at least one variable resistor coupled to the test signal channel, the at least one variable resistor to provide an adjustable resistance to compensate for frequency response variation in the RC probe tip network.

Example 2 includes the test and measurement probe of Example 1, wherein the at least one variable resistor is included in an RC compensation network and the RC compensation network accomplishes frequency compensation independent of a variable capacitor.

Example 3 includes the test and measurement probe of any one of Examples 1-2, wherein the RC compensation network is included in a compensation box coupled to the probe tip.

Example 4 includes the test and measurement probe of Examples 1-3, wherein the test signal channel is a differential channel including a reference channel and a signal channel, and the at least one variable resistor includes a reference channel variable resistor coupled to the reference channel and a signal channel variable resistor coupled to the signal channel.

Example 5 includes the test and measurement probe of any one of Examples 1-4, wherein the at least one variable resistor includes at least two variable resistors with one variable resistor having a coarser adjustment than another variable resistor.

Example 6 includes the test and measurement probe of any one of Examples 1-5, wherein the at least one variable resistor includes at least one variable resistor in the RC probe tip network and at least one variable resistor in a compensation box.

Example 7 includes the test and measurement probe of any one of Examples 1-6, wherein the at least one variable resistor is a digital potentiometer.

Example 8 includes the test and measurement probe of any one of Examples 1-7, wherein the at least one variable resistor is a mechanical resistor.

Example 9 includes the test and measurement probe of any one of Examples 1-8, further comprising a memory module to store a voltage change caused by the at least one variable resistor, and provide the voltage change to a controller with an adjustable amplifier to support adjustment of a gain of a test signal in the test signal channel to compensate for the voltage change.

Example 10 includes the test and measurement probe of any one of Examples 1-9, further comprising an adjustable amplifier to adjust a gain of a test signal in the test signal channel to compensate for a voltage change caused by the at least one variable resistor.

Example 11 includes the test and measurement probe of any one of Examples 1-10, wherein the at least one variable resistor compensates for low frequency response variation in the RC network of the probe tip.

Example 12 includes a test and measurement system comprising: a probe tip including a test signal channel and an Resistor Capacitor (RC) probe tip network coupled to a test signal channel; and a compensation box coupled to the probe tip via the test signal channel, the compensation box including an RC compensation network, the RC compensation network including a static capacitor coupled to the test signal channel and at least one variable resistor coupled to the test signal channel, the at least one variable resistor set to provide a resistance to compensate for frequency variation in the RC probe tip network.

Example 13 includes the test and measurement system of any one of Example 12, further comprising a controller coupled to the compensation box via the test signal channel, the controller including an adjustable amplifier, the controller to control the adjustable amplifier to adjust a gain of a test signal in the test signal channel to compensate for a voltage change caused by the at least one variable resistor.

Example 14 includes the test and measurement system of any one of Example 13, wherein the compensation box further includes a memory module to store a value of a voltage change caused by the at least one variable resistor, and the controller is configured to read the memory module and adjust the gain of the test signal via the adjustable amplifier based on the value of the voltage change read from the memory module.

Example 15 includes the test and measurement system of any one of Examples 12-14, wherein the compensation box accomplishes frequency compensation independent of a variable capacitor.

Example 16 includes the test and measurement system of any one of Examples 12-15, wherein the at least one variable resistor includes at least one variable resistor having a coarser adjustment than at least one other variable resistor.

Example 17 includes the test and measurement system of any one of Examples 12-16, wherein the test signal channel is a differential channel including a reference channel and a signal channel, and the at least one variable resistor includes a reference channel variable resistor coupled to the reference channel and a signal channel variable resistor coupled to the signal channel.

Example 18 includes the test and measurement system of any one of Examples 12-17, wherein the probe tip further includes at least one variable resistor coupled to the test signal channel, the at least one variable resistor set to provide a resistance to compensate for frequency variation in the RC probe tip network.

Example 19 includes the test and measurement system of any one of Examples 12-18, wherein the compensation box further includes an adjustable amplifier set to adjust a gain of a test signal in the test signal channel to compensate for a voltage change caused by the at least one variable resistor.

Example 20 includes the test and measurement system of any one of Examples 12-19, wherein the at least one variable resistor compensates for low frequency variation in the RC network of the probe tip.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. A test and measurement probe comprising:
   a probe tip to connect to a Device Under Test (DUT), the probe tip including a Resistor Capacitor (RC) probe tip network coupled to a test signal channel; and
   at least one variable resistor coupled to the test signal channel, the at least one variable resistor to provide an adjustable resistance to compensate for frequency response variation in the RC probe tip network, wherein the at least one variable resistor is included in an RC compensation network, and the RC compensation network accomplishes frequency compensation independent of a variable capacitor.

2. The test and measurement probe of claim 1, wherein the RC compensation network is included in a compensation box coupled to the probe tip.

3. The test and measurement probe of claim 1, wherein the test signal channel is a differential channel including a reference channel and a signal channel, and the at least one variable resistor includes a reference channel variable resistor coupled to the reference channel and a signal channel variable resistor coupled to the signal channel.

4. The test and measurement probe of claim 1, wherein the at least one variable resistor includes at least two variable resistors, one variable resistor having a coarser adjustment than another variable resistor.

5. The test and measurement probe of claim 1, wherein the at least one variable resistor includes at least one variable resistor in the RC probe tip network and at least one variable resistor in a compensation box.

6. The test and measurement probe of claim 1, wherein the at least one variable resistor is a digital potentiometer.

7. The test and measurement probe of claim 1, wherein the at least one variable resistor is a mechanical resistor.

8. The test and measurement probe of claim 1, further comprising a memory module to store a voltage change caused by the at least one variable resistor, and provide the voltage change to a controller coupled with an adjustable amplifier included in the test signal channel to enable adjustment of a gain of a test signal in the test signal channel to compensate for the voltage change.

9. The test and measurement probe of claim 1, further comprising an adjustable amplifier to adjust a gain of a test signal in the test signal channel to compensate for a voltage change caused by the at least one variable resistor.

10. The test and measurement probe of claim 1, wherein the at least one variable resistor compensates for low frequency response variation in the RC network of the probe tip.

11. A test and measurement system comprising:
    a probe tip including a test signal channel and a Resistor Capacitor (RC) probe tip network coupled to the test signal channel; and
    a compensation box coupled to the probe tip via the test signal channel, the compensation box including an RC compensation network, the RC compensation network including a static capacitor coupled to the test signal channel and at least one variable resistor coupled to the test signal channel, the at least one variable resistor set to provide a resistance to compensate for frequency variation in the RC probe tip network, wherein the compensation box accomplishes frequency compensation independent of a variable capacitor.

12. The test and measurement system of claim 11, further comprising a controller coupled to the compensation box via the test signal channel, the controller including an adjustable amplifier, the controller to control the adjustable amplifier to adjust a gain of a test signal in the test signal channel to compensate for a voltage change caused by the at least one variable resistor.

13. The test and measurement system of claim 12, wherein the compensation box further includes a memory module to store a value of a voltage change caused by the at least one variable resistor, and the controller is configured to read the memory module and adjust the gain of the test signal via the adjustable amplifier based on the value of the voltage change read from the memory module.

14. The test and measurement system of claim 11, wherein the at least one variable resistor includes at least one variable resistor having a coarser adjustment than at least one other variable resistor.

15. The test and measurement system of claim 11, wherein the test signal channel is a differential channel including a reference channel and a signal channel, and the at least one variable resistor includes a reference channel variable resistor coupled to the reference channel and a signal channel variable resistor coupled to the signal channel.

16. The test and measurement system of claim 11, wherein the probe tip further includes at least one variable resistor coupled to the test signal channel, the at least one variable resistor set to provide a resistance to compensate for frequency variation in the RC probe tip network.

17. The test and measurement system of claim 11, wherein the compensation box further includes an adjustable amplifier set to adjust a gain of a test signal in the test signal channel to compensate for a voltage change caused by the at least one variable resistor.

18. The test and measurement system of claim 11, wherein the at least one variable resistor compensates for low frequency response variation in the RC network of the probe tip.

\* \* \* \* \*